United States Patent
Pietri et al.

(10) Patent No.: US 7,834,689 B1
(45) Date of Patent: Nov. 16, 2010

(54) MOS OPERATIONAL AMPLIFIER WITH CURRENT MIRRORING GAIN AND METHOD OF OPERATION

(75) Inventors: Stefano Pietri, Austin, TX (US); Chris C. Dao, Pflugerville, TX (US); Alfredo Olmos, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/507,352

(22) Filed: Jul. 22, 2009

(51) Int. Cl.
    *H03F 3/45* (2006.01)
(52) U.S. Cl. ...................................... 330/253; 330/255
(58) Field of Classification Search .......... 330/252–261
    See application file for complete search history.

(56) References Cited

U.S. PATENT DOCUMENTS

| 5,442,320 | A | 8/1995 | Kunst et al. |
| 6,127,891 | A | 10/2000 | Eschauzier et al. |
| 6,150,883 | A | 11/2000 | Ivanov |
| 6,351,186 | B1 | 2/2002 | Cusinato et al. |
| 6,356,153 | B1 | 3/2002 | Ivanov et al. |
| 7,310,016 | B2 | 12/2007 | Chuang |
| 7,414,473 | B1 | 8/2008 | Rayanakorn et al. |
| 7,714,651 | B2 * | 5/2010 | Bapat et al. ................. 330/253 |

OTHER PUBLICATIONS

Sue, Wen-Whe et al.; "A High DC-Gain Folded-Cascode CMOS Operational Amplifier"; Proceedings of Southeastcon '98; Apr. 24-26, 1998; pp. 176-177; IEEE.

* cited by examiner

*Primary Examiner*—Hieu P Nguyen
(74) *Attorney, Agent, or Firm*—Robert L. King (57) ABSTRACT

An amplifier has an input stage coupled to a current mirror for providing a first control signal. A gain boosting stage has first and second sections, each having first and second inputs and an output. The first input of the first section is coupled to the input stage. The second input of the first section is a first node between a source and a drain of a first pair of series-coupled transistors. The first input of the second section is coupled to the current mirror. The second input of the second section is a second node between a source and a drain of a second pair of series-coupled transistors. A pre-driver stage has inputs coupled to the input stage and the gain boosting stage. The pre-driver stage provides inputs to the gain boosting stage and receives outputs from the gain boosting stage prior to coupling to an output stage.

20 Claims, 2 Drawing Sheets

MOS OPERATIONAL AMPLIFIER WITH CURRENT MIRRORING GAIN AND METHOD OF OPERATION

FIELD OF THE INVENTION

This invention relates generally to semiconductor circuits, and more specifically, to semiconductor amplifier circuits.

BACKGROUND OF THE INVENTION

Conventional MOS amplifier circuits, typically suffer from performance issues such as speed and power consumption. Speed in amplifier circuits is impaired as a result of parasitic capacitance elements and asymmetric operation. For amplifiers that provide output signals that transition from one power supply voltage to another, the operation is known as rail-to-rail operation. As power supply voltage values decrease, the voltage differential in rail-to-rail operation is important.

Conventional amplifiers typically use a plurality of gain stages to achieve a predetermined high gain. However, as a consequence it becomes more difficult to stabilize a closed loop system having a plurality of gain stages. It is desired to have only one dominant frequency pole in a closed loop system. However, a large number of frequency poles are created by the multiple gain stages. Non-dominant poles must be of a high frequency relative to the frequency of the dominant pole to avoid a reduction in the system's phase margin. Conventional methods used to compensate for the system include pushing the dominant pole to a low frequency or move the non-dominant poles to higher frequencies or both. These techniques require additional circuitry and thus circuit area and additional power to operate the circuitry and to push non-dominant pole to a higher frequency. Another technique is to pull the dominate frequency pole to a lower frequency. This can be achieved for example with passive circuitry, such as Miller compensation capacitors. Conventional amplifiers typically require a high power supply voltage to obtain both a high gain and a high frequency bandwidth or they do not have rail-to-rail output capability. Rail-to-rail capability is required for many applications as a greater span in voltage value for a signal permits a higher signal-to-noise ratio to be obtained. As power supply voltage values decrease, the small voltage span has only made this performance issue more critical.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
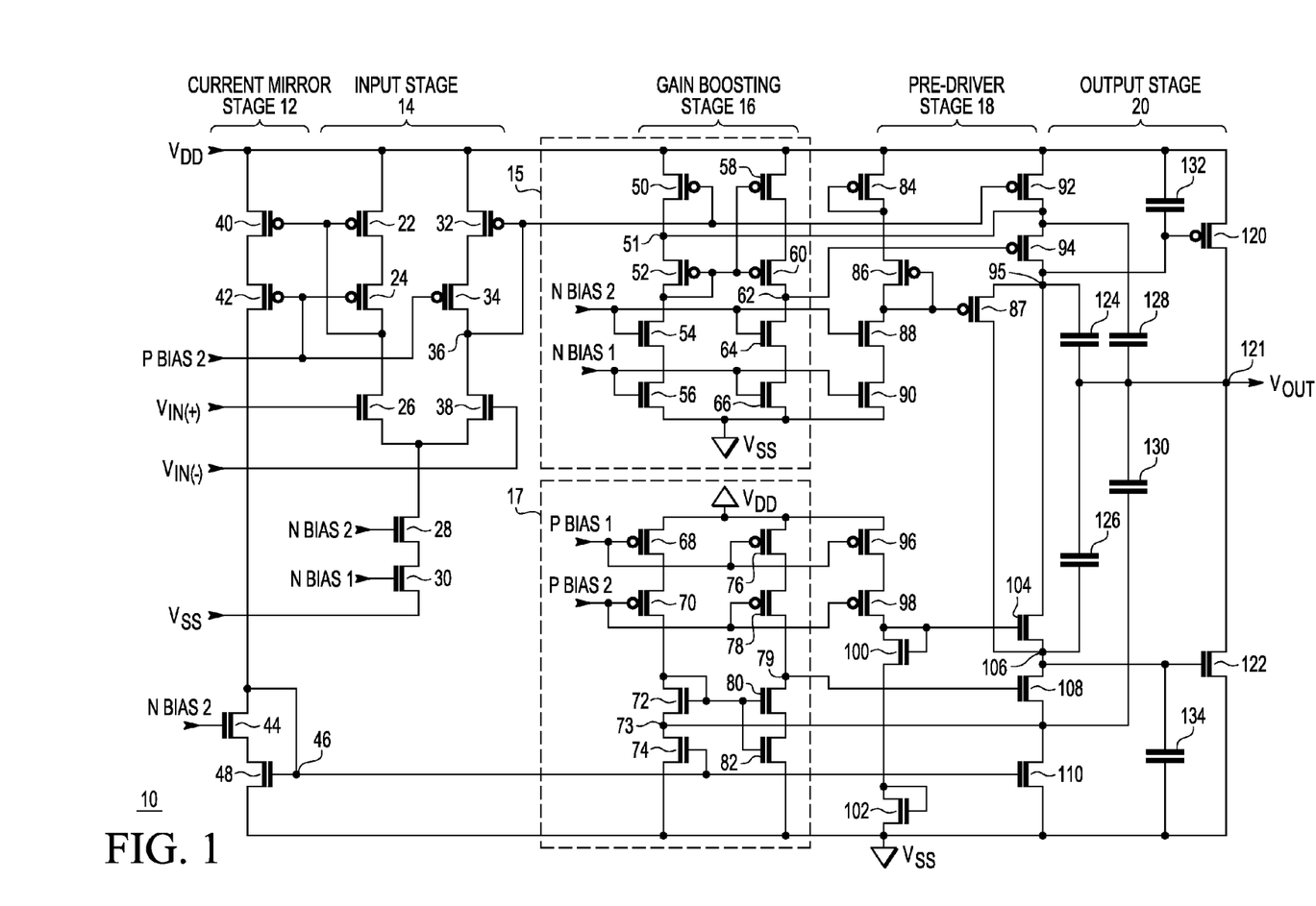
FIG. 1 illustrates in schematic diagram form an operational amplifier in accordance with a first form of the present invention.

Illustrated in FIG. 1 is an operational amplifier 10 generally having a current mirror stage 12, an input stage 14, a gain boosting stage 16 having a first section 15 for driving P-channel devices and a second section 17 for driving N-channel devices, a pre-driver stage 18 and an output stage 20. The operational amplifier 10 provides signal amplification of a differential input signal by using a high current rail to rail capability.

Within the input stage 14 is an operational amplifier formed by P-channel transistors 22, 24, 32, 34 and N-channel transistors 26, 38, 28 and 30. A source or current electrode of transistor 22 is connected to a voltage terminal for receiving a power supply voltage designated as $V_{DD}$. A drain or current electrode of transistor 22 is connected to a source of transistor 24. A gate or control electrode of transistor 24 is connected to a terminal for receiving a bias voltage for a P-channel device labeled "P Bias 2". A drain of N-channel transistor 26 is connected to a drain of transistor 24 which provides a first output of the input stage 14. A gate of transistor 26 is connected to a terminal for receiving a first input signal labeled "$V_{IN(+)}$". A source of transistor 26 is connected to a drain of N-channel transistor 28. A gate of transistor 28 is connected to a terminal for receiving a bias voltage for an N-channel device labeled "N Bias 2". A source of transistor 28 is connected to a drain of an N-channel transistor 30. A gate of transistor 30 is connected to a terminal for receiving a bias voltage for an N-channel device labeled "N Bias 1". A source of transistor 30 is connected to a voltage terminal for receiving a second supply voltage labeled "$V_{SS}$". In one form the $V_{SS}$ supply voltage is a ground reference voltage. A source of P-channel transistor 32 is connected to the voltage terminal for receiving $V_{DD}$. A gate of transistor 32 is connected to a drain of P-channel transistor 34 at a node 36 for providing a second output of the input stage 14. A drain of transistor 32 is connected to a source of transistor 34. A gate of transistor 34 is connected to a terminal for receiving the P Bias 2 bias voltage. The drain of transistor 34 is also connected to a drain of N-channel transistor 38 at node 36. A gate of transistor 38 is connected to a terminal for receiving a second input voltage labeled "$V_{IN(-)}$". A source of transistor 38 is connected to the source of transistor 26 and to the drain of transistor 28.

The current mirror stage 12 has a P-channel transistor 40 having a source connected to the voltage terminal for receiving $V_{DD}$. A gate of transistor 40 is connected to the gate of transistor 22 and drain of transistor 24. A drain of transistor 40 is connected to a source of a P-channel transistor 42. A gate of transistor 42 is connected to the gate of transistor 24 and to the P Bias 2 signal. A drain of transistor 42 is connected to a drain of an N-channel transistor 44. A gate of transistor 44 is connected to a terminal of receiving the N Bias 2 signal. A source of transistor 44 is connected to a drain of an N-channel transistor 48. A gate of transistor 48 is connected to a drain of transistor 44 at a node 46. A source of transistor 48 is connected to a voltage terminal for receiving the second supply voltage $V_{SS}$.

The first section 15 of the gain boosting stage 16 has P-channel transistor 50 having a source connected to the voltage terminal for receiving $V_{DD}$. A gate of transistor 50 is connected to node 36 for receiving the second output of the input stage 14. A drain of transistor 50 is connected to a source of a P-channel transistor 52 at a node 51. A gate of transistor 52 is connected to a source thereof and to a drain of an N-channel transistor 54. A gate of transistor 54 is connected to a terminal for receiving the N Bias 2 signal. A source of transistor 54 is connected to a drain of an N-channel transistor 56. A gate of transistor 56 is connected to a terminal for receiving the N Bias 1 signal. A drain of transistor 56 is connected to a terminal for receiving the $V_{SS}$ supply voltage. A P-channel transistor 58 has a source connected to the terminal for receiving the $V_{DD}$ supply voltage. A gate of transistor 58 is connected to the gate of transistor 52. A drain of transistor 58 is connected to a source of a P-channel transistor 60. A gate of transistor 60 is connected to the gate of both of transistors 58 and 52. A drain of transistor 60 is connected to a drain of an N-channel transistor 64 at a node 62. A gate of transistor 64 is connected to the N Bias 2 signal, and a source of transistor 64 is connected to a drain of an N-channel transistor 66. A gate of transistor 66 is connected to the N Bias 1 signal, and a source of transistor 66 is connected to the $V_{SS}$ supply voltage.

The second section 17 of the gain boosting stage 16 has P-channel transistor 68 having a source connected to the voltage terminal for receiving $V_{DD}$. A gate of transistor 68 is connected to receive the P Bias 1 signal. A drain of transistor 68 is connected to a source of a P-channel transistor 70. A gate of transistor 70 is connected to receive the P Bias 2 signal. A drain of transistor 70 is connected to a drain and a gate of an N-channel transistor 72 that are connected together. A source of transistor 72 is connected at a node 73 to a drain of an N-channel transistor 74. A gate of transistor 74 is connected to the gate of transistor 48. A source of transistor 74 is connected to the $V_{SS}$ supply voltage terminal. A source of a P-channel transistor 76 is connected to the $V_{DD}$ supply voltage terminal. A gate of transistor 76 is connected to the P Bias 1 signal. A drain of transistor 76 is connected to a source of a P-channel transistor 78. A gate of transistor 78 is connected to the P Bias 2 signal. A drain of transistor 78 is connected at a node 79 to a drain of an N-channel transistor 80. A gate of transistor 80 is connected to a gate of an N-channel transistor 82. A source of transistor 80 is connected to a drain of transistor 82. Because the gates of transistors 80 and 82 are connected together, a composite transistor 80, 82 is formed between node 79 and the $V_{SS}$ supply voltage terminal. A source of transistor 82 is connected to the terminal for receiving the $V_{SS}$ supply voltage.

The pre-driver stage 18 has a P-channel transistor 84 having a source connected to the $V_{DD}$ supply voltage, and a gate connected to a drain thereof. The drain of transistor 84 is connected to a source of a P-channel transistor 86. A gate of transistor 86 is connected to a drain thereof and to a drain of an N-channel transistor 88. A gate of transistor 88 receives the N Bias 2 signal. A source of transistor 88 is connected to a drain of an N-channel transistor 90. A gate of transistor 90 is connected to the N Bias 1 signal. A source of transistor 90 is connected to the $V_{SS}$ supply voltage. A P-channel transistor 92 has a source connected to the $V_{DD}$ supply voltage. A gate of transistor 92 is connected to the gate of transistor 32. A drain of transistor 92 is connected at node 51 to a source of a P-channel transistor 94. A gate of transistor 94 is connected to node 62 of the gain boosting stage 16 for receiving a first output of the gain boosting stage 16. A drain of transistor 94 is connected to a drain of an N-channel transistor 104 at a node 95. A source of a P-channel transistor 87 is connected at a node 95 to the drain of transistor 94. A gate of transistor 87 is connected to the gate and drain of transistor 86. A drain of transistor 87 is connected to a source of transistor 104 at a node 106. The pre-driver stage 18 also has a P-channel transistor 96 having a source connected to the terminal for receiving the $V_{DD}$ supply voltage. A gate of transistor 96 is connected to the P Bias 1 signal, and a drain of transistor 96 is connected to a source of a P-channel transistor 98. A gate of transistor 98 is connected to the P Bias 2 signal. A drain of transistor 98 is connected to a drain and a gate of an N-channel transistor 100. A source of transistor 100 is connected to a drain of an N-channel transistor 102. The drain of transistor 102 is connected to a gate thereof. A source of transistor 102 is connected to the $V_{SS}$ supply voltage. A gate of transistor 104 is connected to the drain of transistor 98. A source of transistor 104 is connected to a drain of an N-channel transistor 108 at a node 106. A gate of transistor 108 is connected to node 79 of the gain boosting stage 16 for receiving a second output of the gain boosting stage 16. A drain of an N-channel transistor 110 is connected at node 73 to a source of transistor 108. A gate of transistor 110 is connected to the gate of transistor 48. A source of transistor 110 is connected to the $V_{SS}$ supply voltage terminal.

The output stage 20 has a capacitor 132 having a first electrode connected to the $V_{DD}$ supply voltage. A second electrode of the capacitor 132 is connected to both a gate of a P-channel transistor 120 and the drain of transistor 94 at node 95. A first terminal of a Miller compensation capacitor 124 is connected to the drain of transistor 94 at node 95. A second terminal of the Miller compensation capacitor 124 is connected to the output terminal at a node 121 for providing the output signal $V_{OUT}$. A first electrode of a Miller compensation capacitor 128 is connected to the source of transistor 94. A second electrode of the Miller compensation capacitor 128 is connected to node 121. A first electrode of a Miller compensation capacitor 126 is connected to node 121. A second electrode of capacitor 126 is connected to node 106. A first electrode of a Miller compensation capacitor 130 is connected to node 121, and a second electrode of the capacitor 130 is connected node 73. A first electrode of a capacitor 134 is connected to node 106, and a second electrode of capacitor 134 is connected to the $V_{SS}$ supply voltage terminal. A source of transistor 120 is connected to a terminal for receiving the $V_{DD}$ supply voltage. A drain of transistor 120 is connected at node 121 to a drain of an N-channel transistor 122. A gate of transistor 122 is connected to a first electrode of the capacitor 134. A source of transistor 122 is connected to the $V_{SS}$ supply voltage terminal. In this configuration transistors 24, 28, 34, 42, 44, 52, 54, 60, 64, 70, 72, 78, 80, 88, 94, 98 and 108 are cascode transistors which are characterized as being coupled to one of the supply rails by an intervening transistor.

In operation, a differential input signal having $V_{IN(+)}$ and $V_{IN(-)}$ is provided to respective inputs of the input stage 14 at the gates of transistors 26 and 38. In response to the $V_{IN(+)}$ having a greater voltage than $V_{IN(-)}$, an initial current is generated in the differential pair of transistors 26 and 38 which flows from transistor 26 to transistor 38. This circuit condition pulls down the gate of transistor 22 and pulls up the gate of transistor 32 at node 36 which is an output of the input stage 14. This circuit condition therefore causes transistor 22 to conduct more and transistor 32 to conduct less. This circuit condition is mirrored from transistor 22 to transistor 40 which conducts a proportional mirror current through transistors 42 and 44 to transistor 48. Accordingly, the gate of transistor 48 increases and transistor 48 conducts more current. This current is mirrored by the transistors 74 and 110. Transistor 74 biases the gain boosting stage 17 while transistor 110 of the pre-driver stage 18 mirrors a current in the pre-driver stage 18. When the gate voltage of transistor 74 increases, the voltage at the node 73 decreases by an amount equal to the current variation in transistor 74 divided by the transconductance, $g_m$, of transistor 72. Transconductance or mutual conductance is a property of transistors that is the ratio of the current at the output terminal (drain) and the voltage at the input terminal (gate). In response, the voltage increase on node 79 is equal to the voltage drop on node 73 multiplied by the $g_m$ of transistor 80/82 divided by the output conductance, $g_o$, of transistor 80/82. The output conductance is the reciprocal of the output resistance. The net effect is a gain boosting from node 73 to node 79 so that the output conductance at node 106 is equal to the output conductance of transistor 110 multiplied by the transconductance of transistor 108. The voltage increase at node 79 is applied to the gate of transistor 108 which makes transistor 108 more conductive. Thus the voltage at node 106 drops which makes transistor 122 less conductive. The output conductance from node 106 to ground, $g_o$ (106), is equal to:

$$g_o(106)=[(1/g_m(72)][(g_m(80/82)/g_o(80/82)][g_m(108)/g_o(108)][1/g_o(110)] \quad \text{Eq. 1}$$

Similarly, the voltage increase at node 36 causes a decrease of current to be conducted by transistor 50 and transistor 92. This decrease causes node 51 to decrease in voltage. Node 62 increases in response thereto and that causes node 95 to decrease. In response to node 95 decreasing the transistor 120 is made more conductive and forces a high amount of output current from $V_{DD}$ to $V_{OUT}$. Node 121 therefore transitions high in response to the $V_{IN(+)}$ input signal being greater than $V_{IN(-)}$. The output conductance from node 95 to $V_{DD}$ may be represented as:

$$g_o(95)=[1/g_m52][(g_m(58/60)/g_o(58/60)][g_m(94)/g_o(94)][1/g_o(92)]. \quad \text{Eq. 2}$$

Therefore, the total D.C. gain of the operational amplifier 10 may be represented as:

$$Av=[g_m(26)/[g_o(95)+g_o(106)]][g_m(122)+g_m(120)]/[g_o(122)+g_o(120)]] \quad \text{Eq. 3}$$

When the input voltages are the same value, the bias current conducted by transistors 120 and 122 of the output stage 20 is a predetermined value. When the input voltages become unbalanced in either direction, the transistors 87 and 104 maintain a differential voltage between the gate of transistor 120 and the gate of transistor 122. In other words, transistors 87 and 104 electrically isolate the gates of transistors 120 and 122. This differential voltage allows only one of transistors 120 and 122 to be actively biased to a conductive state. Thus the total amount of current that can be driven or sunk is much greater than the bias current in the equilibrium input signal condition. This type of operation is conventionally known as a Class AB amplifier.

It should be noted that the current mirror stage 12 provides a control signal at node 46 to both the gain boosting stage 16 (at the second portion 17) and the pre-driver stage 18 at the gate of transistor 110. Similarly and symmetrically, one of the outputs of the input stage 14 at node 36 provides another control signal for both the gain boosting stage 16 (at the first portion 15) and the pre-driver stage 18 at the gate of transistor 92. It should also be noted that the gain boosting is not obtained with a conventional five-transistor transconductance amplifier. The significance of this fact is that the gain boosting stage 16 can operate with a lower power supply voltage and only needs a combination of one transistor gate-to-source voltage, $V_{GS}$, (transistor 72) and either two (transistors 68 and 74) or three (transistors 68, 70 and 74) transistor drain-to-source voltages, $V_{DS}$, to amplify the input signal from the pre-driver stage at node 51 and node 73 back to the gate of transistor 94 and transistor 108, respectively.

It should be noted that the output signals provided at node 36 and node 46 to both the gain boosting stage and the pre-driver stage 18 is not the only input signal that is provided to the gain boosting stage 16. In particular, the pre-driver stage 18 provides a second input signal to the gain boosting stage 16 at a source/drain node of the gain boosting stage 16 rather than to a gate of a transistor. The advantage of providing the signal to a source/drain node rather than to a gate of a transistor is decreased parasitics and capacitance which results in the ability of the gain boosting stage 16 to provide higher frequency poles at lower current. In other words for a predetermined current consumption the frequency response is significantly improved as compared with inputting an input signal into a transistor gate of a conventional transconductance amplifier.

Additional advantages of the implementation provided for the gain boosting stage 16 include the fact that variations in frequency response between the first portion 15 and the second portion 17 is very similar. A conventional operational amplifier will need to implement an N-channel and a P-channel amplifier. To match their gains the transconductance of the P-channel transistors must be size ratioed to be three times the transconductance of the N-channel transistors. The size ratios of 3:1 are susceptible to significant variation and thus result in nonlinearity and harmonic distortion in transient response. In contrast, the gain equations provided above in connection with equations (1) and (2) use single ratios of the transconductances and the variations of the transistor transconductance do not have the same significant impact as with a conventional amplifier circuit.

It should be understood that the capacitors 124, 126, 128, 130, 132 and 134 are frequency compensation capacitors for adjusting frequency poles to high frequency. Capacitors 124 and 126 are symmetric in location and value. Capacitors 128 and 130 are also symmetric in location and value. Similarly, capacitors 132 and 134 are symmetric in location and value. Capacitors 132 and 134 are mainly for noise decoupling.

Figure 2:
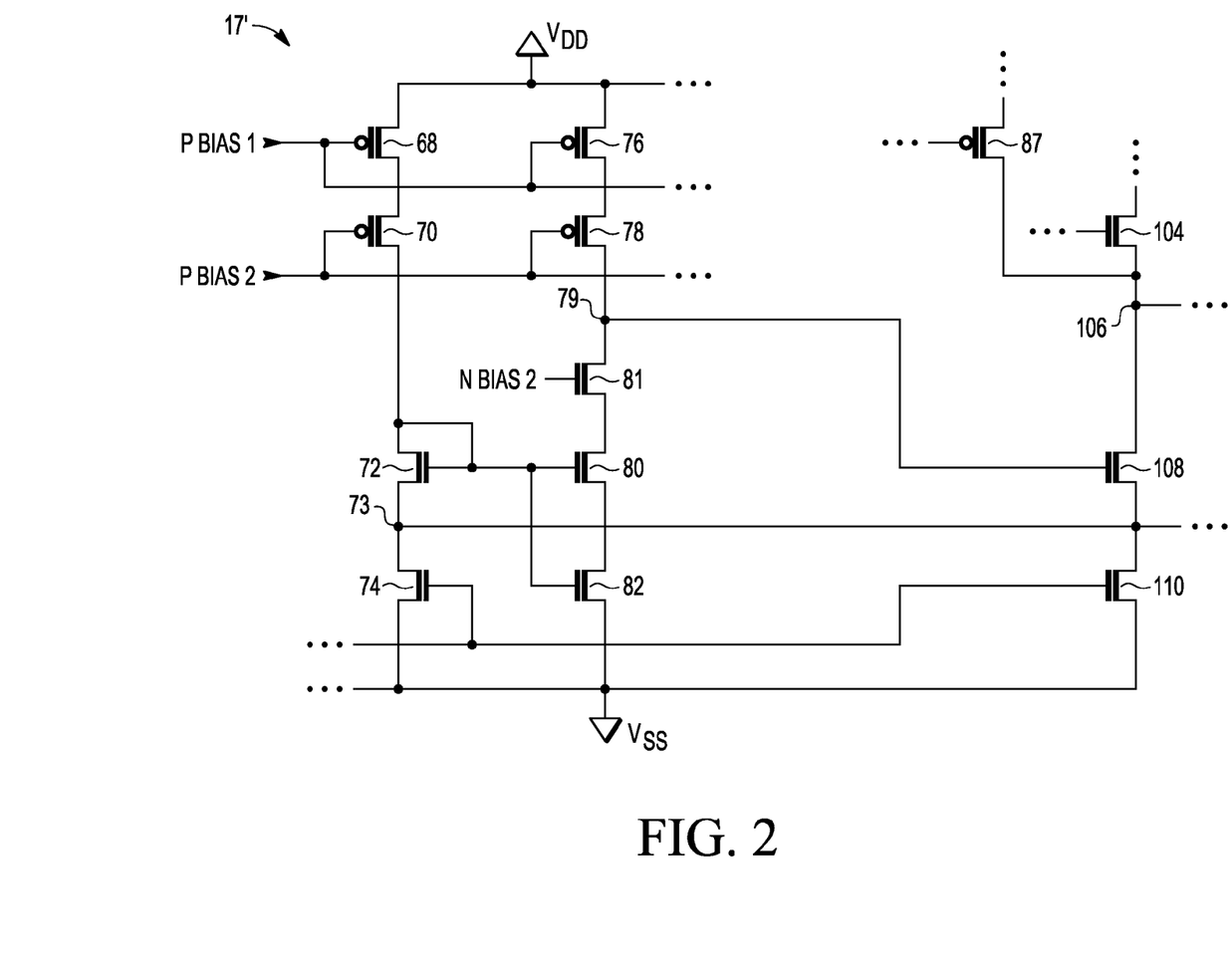
FIG. 2 illustrates in schematic diagram form another form of the gain boosting stage of operational amplifier of FIG. 1.

Illustrated in FIG. 2 is an alternate form of the operational amplifier 10 of FIG. 1 wherein a modified section 17' of the gain boosting stage 16 is provided. The section 17' is a modification of section 17 which provides additional gain. For convenience of explanation and understanding, elements that are common between FIG. 2 and FIG. 1 are numbered the same. An additional cascode transistor 81 is added to increase gain without affecting the speed or low voltage capability of the gain boosting stage 16. An N-channel transistor 81 is inserted with its gate connected to the N Bias 2 signal. Transistor 81 has a drain connected to node 79 and a source connected to the drain of transistor 80. All other connections associated with the gain boosting stage section 17' are the same as with section 17.

In operation, transistor 140, 142 and 144 form an additional gain stage with the gain boosting stage to provide additional amplification. Transistor 140 is biased to establish a current through transistors 142 and 144. Transistor 142 is similarly biased to increase the output gain at node 143. Transistor 144 is controlled by the output at node 79 to further amplify that output. Thus, additional gain has been provided by the addition of three transistors. Merely increasing the size of the transistors in section 17 will increase gain but will also reduce the bandwidth of operation. In the embodiment of FIG. 2 the gain is increased without significantly affecting bandwidth and other performance criteria. It should be appreciated that a similar change to section 15 would be implemented to increase the gain of that section if desired. In such an implementation a reciprocal circuit (i.e. inverted) would be implemented.

By now it should be appreciated that there has been provided an operational amplifier which has improved frequency response and less current consumption with rail-to-rail voltage outputs. The sections 15 and 17 of the gain boosting stage 16 implement low-voltage current mirrors and do not use an explicit amplifier circuit to perform amplification of the outputs of the input stage. The implementation of sections 15 and 17 therefore require less circuit area, use less current consumption than an amplifier circuit and have an inherent faster response. The overall dynamic performance of operational amplifier 10 is thereby improved. Because the signals from the pre-driver stage 18 that are coupled at nodes 51 and 73 back to the gain boosting stage 16 are connected to a circuit node that is not a transistor gate, the signals are connected to a lower capacitive input of the gain boosting stage 16. As a result, lower voltage is required to drive the gain boosting stage 16 and less power loss occurs within the gain boosting stage 16.

In the foregoing specification, the invention has been described with reference to specific embodiments. However, one of ordinary skill in the art appreciates that various modifications and changes can be made without departing from the scope of the present invention as set forth in the claims below. For example, the circuit implementation of the input stage 14 may be implemented with a folded-cascode structure instead of the illustrated operational amplifier input stage 14 of FIG. 1. In such an alternate configuration, transistors 22, 24, 32 and 34 of the input stage 14 would be removed. As a result, the gate of transistor 40 is connected to the P Bias 1 signal, and the drain of transistor 26 is connected to the source of transistor 42. Additionally, the drain of transistor 38 is connected to node 51 rather than to the gates of transistors 50 and 92. Each of the gates of transistors 50 and 92 is connected to the P Bias 1 signal. All other circuit connections of FIG. 1 remain the same. In such an alternate form the modified input stage still has differential inputs and differential outputs and transistor 28 remains a cascode device. Because the current within the input stage is mirrored and the direction of the current is changed from right to left, there is folding of the current. Such input configurations are commonly referred to as a folded cascode configuration.

In one form there is herein provided an amplifier having an input stage for receiving a differential input signal and providing a first output and a second output. A current mirror has an input coupled to the first output of the input stage and has an output for providing a first control signal. A gain boosting stage has a first section and a second section. Each of the first section and the second section has a first input, a second input, and an output. The first input of the first section is coupled to the second output of the input stage. The second input of the first section has a first node between a source and a drain of a first pair of series-coupled transistors. The first input of the second section is coupled to the output of the current mirror. The second input of the second section is a second node between a source and a drain of a second pair of series-coupled transistors. A pre-driver stage has a first input coupled to the second output of the input stage. A second input is coupled to the output of the first section of the gain boosting stage. A third input is coupled to the output of the current mirror. A fourth input is coupled to the output of the second section of the gain boosting stage. A first output is coupled to the second input of the first section of the gain boosting stage. The pre-driver stage has a second output. A third output of the pre-driver stage is coupled to the second input of the second section of the gain boosting stage. The pre-driver stage has a fourth output. An output stage has a first input coupled to the second output of the pre-driver stage, a second input coupled to the fourth output of the pre-driver stage, and an output for providing an output signal.

In another form the first section of the gain boosting stage has a first transistor of a first conductivity type having a first current electrode coupled to a first voltage terminal, a control electrode coupled to the second output of the input stage, and a second current electrode. A second transistor of the first conductivity type has a first current electrode coupled to the second current electrode of the first transistor, and a control electrode coupled to a second current electrode thereof, wherein the first transistor and second transistor form the first pair of series-coupled transistors. A third transistor of a second conductivity type has a first current electrode coupled to the second current electrode of the second transistor, a control electrode for receiving a first bias signal, and a second current electrode. A fourth transistor of the second conductivity type has a first current electrode coupled to the second current electrode of the third transistor, a control electrode for receiving a second bias signal, and a second current electrode coupled to a second voltage terminal. A fifth transistor of the first conductivity type has a first current electrode coupled to the first voltage terminal, a second current electrode, and a control electrode coupled to the control electrode of the second transistor. A sixth transistor of the first conductivity type has a first current electrode coupled to the second current electrode of the fifth transistor, a control electrode coupled to the control electrode of the second and fifth transistor, and a second current electrode. A seventh transistor of the second conductivity type has a first current electrode coupled to the second current electrode of the sixth transistor, a control electrode coupled to the first bias signal, and a second current electrode. An eighth transistor of the second conductivity type has a first current electrode coupled to the second current electrode of the seventh transistor, a control electrode for receiving the second bias signal, and a second current electrode coupled to the second voltage terminal.

In another form the second section of the gain boosting stage has a first transistor of a first conductivity type having a first current electrode coupled to a first voltage terminal, a control electrode coupled to a first bias signal, and a second current electrode. A second transistor of the first conductivity type has a first current electrode coupled to the second current electrode of the first transistor, a control electrode coupled to a second bias signal, and a second current electrode. A third transistor of a second conductivity type has a first current electrode coupled to the second current electrode of the second transistor and to a control electrode thereof, and a second current electrode. A fourth transistor of the second conductivity type has a first current electrode coupled to the second current electrode of the third transistor, a control electrode coupled to the output of the current mirror, and a second current electrode coupled to a second voltage terminal, wherein the third transistor and fourth transistor comprise the second pair of series-coupled transistors. A fifth transistor of the first conductivity type has a first current electrode coupled to the first voltage terminal, a second current electrode, and a control electrode coupled to the control electrode of the first transistor. A sixth transistor of the first conductivity type has a first current electrode coupled to the second current electrode of the fifth transistor, a control electrode for receiving a second bias signal, and a second current electrode. A seventh transistor of the second conductivity type has a first current electrode coupled to the second current electrode of the sixth transistor, a control electrode coupled to the control electrode of the third transistor, and a second current electrode. An eighth transistor of the second conductivity type has a first current electrode coupled to the second current electrode of the seventh transistor, a control electrode coupled to the control electrode of the third and seventh transistors, and a second current electrode coupled to the second voltage terminal.

In another form the gain boosting stage has a first transistor of a first conductivity type having a first current electrode coupled to a first voltage terminal, a control electrode coupled to the second output of the input stage, and a second current electrode. A second transistor of the first conductivity type has a first current electrode coupled to the second current electrode of the first transistor, a control electrode coupled to a second current electrode thereof, wherein the first transistor and second transistor comprise the first pair of series-coupled transistors. A third transistor of a second conductivity type has a first current electrode coupled to the second current electrode of the second transistor, a control electrode for receiving a first bias signal, and a second current electrode. A fourth transistor of the second conductivity type has a first current electrode coupled to the second current electrode of the third transistor, a control electrode for receiving a second bias signal, and a second current electrode coupled to a second voltage terminal. A fifth transistor of the first conductivity type has a first current electrode coupled to the first voltage terminal, a second current electrode, and a control electrode coupled to the control electrode of the second transistor. A sixth transistor of the first conductivity type has a first current electrode coupled to the second current electrode of the fifth transistor, a control electrode coupled to the control electrode of the second and fifth transistor, and a second current electrode. A seventh transistor of the second conductivity type has a first current electrode coupled to the second current electrode of the sixth transistor, a control electrode coupled to the first bias signal, and a second current electrode. An eighth transistor of the second conductivity type has a first current electrode coupled to the second current electrode of the seventh transistor, a control electrode for receiving the second bias signal, and a second current electrode coupled to the second voltage terminal. A ninth transistor of the first conductivity type has a first current electrode coupled to a first voltage terminal, a control electrode coupled to the third bias signal, and a second current electrode. A tenth transistor of the first conductivity type has a first current electrode coupled to the second current electrode of the ninth transistor, a control electrode coupled to the fourth bias signal, and a second current electrode. An eleventh transistor of the second conductivity type has a first current electrode coupled to the second current electrode of the tenth transistor and to a control electrode thereof, and a second current electrode. A twelfth transistor of the second conductivity type has a first current electrode coupled to the second current electrode of the eleventh transistor, a control electrode coupled to the output of the current mirror, and a second current electrode coupled to the second voltage terminal, wherein the eleventh transistor and twelfth transistor comprise the second pair of series-coupled transistors. A thirteenth transistor of the first conductivity type has a first current electrode coupled to the first voltage terminal, a second current electrode, and a control electrode coupled to the control electrode of the ninth transistor. A fourteenth transistor of the first conductivity type has a first current electrode coupled to the second current electrode of the thirteenth transistor, a control electrode for receiving a fourth bias signal, and a second current electrode. A fifteenth transistor of the second conductivity type has a first current electrode coupled to the second current electrode of the fourteenth transistor, a control electrode coupled to the control electrode of the eleventh transistor, and a second current electrode. A sixteenth transistor of the second conductivity type has a first current electrode coupled to the second current electrode of the fifteenth transistor, a control electrode coupled to the control electrode of the eleventh and fifteenth transistors, and a second current electrode coupled to the second voltage terminal.

In another form the second section of the gain boosting stage further has a first transistor of a first conductivity type having a first current electrode coupled to a first voltage terminal, a control electrode coupled to a first bias signal, and a second current electrode. A second transistor of the first conductivity type has a first current electrode coupled to the second current electrode of the first transistor, a control electrode coupled to a second bias signal, and a second current electrode. A third transistor of a second conductivity type has a first current electrode coupled to the second current electrode of the second transistor and to a control electrode thereof, and a second current electrode. A fourth transistor of the second conductivity type has a first current electrode coupled to the second current electrode of the third transistor, a control electrode coupled to the output of the current mirror, and a second current electrode coupled to a second voltage terminal, wherein the third transistor and the fourth transistor form the second pair of series-coupled transistors. A fifth transistor of the first conductivity type has a first current electrode coupled to the first voltage terminal, a second current electrode, and a control electrode coupled to the control electrode of the first transistor. A sixth transistor of the first conductivity type has a first current electrode coupled to the second current electrode of the fifth transistor, a control electrode for receiving a second bias signal, and a second current electrode. A seventh transistor of the second conductivity type has a first current electrode coupled to the second current electrode of the sixth transistor, a control electrode coupled to the control electrode of the third transistor, and a second current electrode. An eighth transistor of the second conductivity type has a first current electrode coupled to the second current electrode of the seventh transistor, a control electrode coupled to the control electrode of the third and seventh transistors, and a second current electrode coupled to the second voltage terminal. A ninth transistor of the first conductivity type has a first current electrode coupled to the first voltage terminal, a control electrode coupled to the control electrode of the first transistor for receiving the third bias signal, and a second current electrode. A tenth transistor of the first conductivity type has a first current electrode coupled to the second current electrode of the ninth transistor, a control electrode coupled to the control electrode of the second transistor for receiving the fourth bias signal, and a second current electrode. An eleventh transistor of the second conductivity type has a first current electrode coupled to the second current electrode of the tenth transistor, a control electrode coupled to the second current electrode of the sixth transistor, and a second current electrode coupled to the second voltage terminal.

In another form the input stage has a first transistor of a first conductivity type having a first current electrode coupled to a first voltage terminal, a control electrode, and a second current electrode. A second transistor of the first conductivity type has a first current electrode coupled to the second current electrode of the first transistor, a control electrode for receiving a bias signal, and a second current electrode coupled to the control electrode of the first transistor for providing the first output. A third transistor of a second conductivity type has a first current electrode coupled to the second current electrode of the second transistor, a control electrode for receiving a first signal of the differential input signal, and a second current electrode. A fourth transistor of the first conductivity type has a first current electrode coupled to the first voltage terminal, a control terminal, and a second current electrode. A fifth transistor of the first conductivity type has a first current electrode coupled to the second current electrode of the fourth transistor, a control electrode for receiving the bias signal, and a second current electrode for providing the second output and being coupled to the control electrode of the fourth transistor. A sixth transistor of the second conductivity type has a first current electrode coupled to the second current electrode of the fifth transistor, a control electrode for receiving a second signal of the differential input signal, and a second current electrode coupled to the second current electrode of the third transistor. A seventh transistor of the second conductivity type has a first current electrode coupled to the second current electrode of the third transistor and the sixth transistor, a control electrode for receiving a second bias signal, and a second current electrode. An eighth transistor of the second conductivity type has a first current electrode coupled to the second current electrode of the seventh transistor, a control electrode for receiving a third bias signal, and a second current electrode coupled to a second voltage terminal.

In one form the current mirror has ninth, tenth, eleventh and twelfth transistors. A ninth transistor of the first conductivity type has a first current electrode coupled to the first voltage terminal, a control electrode coupled to the control electrode of the first transistor, and a second current electrode. A tenth transistor of the first conductivity type has a first current electrode coupled to the second current electrode of the ninth transistor, a control electrode coupled to the control electrode of the second transistor for receiving the first bias signal, and a second current electrode. An eleventh transistor has a first current electrode coupled to the second current electrode of the tenth transistor, a second current electrode for receiving the second bias signal, and a second current electrode. A twelfth transistor has a first current electrode coupled to the second current electrode of the eleventh transistor, a control electrode coupled to the first current electrode of the eleventh transistor for providing the first control signal, and a second current electrode coupled to a second voltage terminal.

In another form there is provided a method wherein a differential input signal is received and a first output signal and a second output signal are provided in response thereto. The first output signal is coupled to a current mirror for providing a control signal. The second output signal is coupled to both a gain boosting stage for biasing the gain boosting stage and to a driver stage. The control signal is coupled to both the gain boosting stage for biasing the gain boosting stage and to the driver stage. Within the driver stage first and second input signals are generated for the gain boosting stage. The first and second input signals are amplified within the gain boosting stage to generate first and second output signals with a predetermined gain. The first and second output signals are used to drive an output stage and provide an output voltage at an output terminal.

In another form the first and second input signals generated within the driver stage are coupled to respective first and second circuit nodes within the gain boosting stage and between respective first and second pairs of series-coupled transistors within the gain boosting stage, thereby not coupling the first and second input signals to a control electrode of a transistor. In yet another form the output stage is implemented as a Class AB output stage.

In yet another form the gain boosting stage is implemented with first and second sections, each being biased by two separate bias signals and having a same number of transistors in each section. In another form the gain of the gain stage is increased by respectively adding a plurality of series-coupled transistors in parallel to each of the first and second sections of the gain boosting stage for generating the first and second output signals.

In yet another form there is provided an amplifier having an input stage for receiving a differential input signal and providing a first output and a second output. A current mirror has an input coupled to the first output of the input stage and has an output for providing a first control signal. A gain boosting stage has a first section and a second section, each of the first section and the second section has first and second pluralities of series-coupled transistors of first and second opposite conductivities. All transistors of a second conductivity of the first section are biased by one of first and second bias signals. All transistors of a first conductivity of the second section are biased by one of third and fourth bias signals. The gain boosting stage has a first input, a second input, and an output. The first input of the first section is coupled to the second output of the input stage. The second input of the first section is a first node between a source and a drain of a first pair of series-coupled transistors. The first input of the second section is coupled to the output of the current mirror. The second input of the second section is a second node between a source and a drain of a second pair of series-coupled transistors. A pre-driver stage has a first input coupled to the second output of the input stage, a second input coupled to the output of the first section of the gain boosting stage, a third input coupled to the output of the current mirror, a fourth input coupled to the output of the second section of the gain boosting stage, a first output coupled to the second input of the first section of the gain boosting stage, a second output, a third output coupled to the second input of the second section of the gain boosting stage, and a fourth output. An output stage has a first input coupled to the second output of the pre-driver stage, a second input coupled to the fourth output of the pre-driver stage, and an output for providing an output signal.

In another form the first section of the gain boosting stage is a first transistor of a first conductivity type having a first current electrode coupled to a first voltage terminal, a control electrode coupled to the second output of the input stage, and a second current electrode. A second transistor of the first conductivity type has a first current electrode coupled to the second current electrode of the first transistor, a control electrode coupled to a second current electrode thereof, wherein the first transistor and second transistor are the first pair of series-coupled transistors. A third transistor of a second conductivity type has a first current electrode coupled to the second current electrode of the second transistor, a control electrode for receiving a first bias signal, and a second current electrode. A fourth transistor of the second conductivity type has a first current electrode coupled to the second current electrode of the third transistor, a control electrode for receiving a second bias signal, and a second current electrode coupled to a second voltage terminal. A fifth transistor of the first conductivity type has a first current electrode coupled to the first voltage terminal, a second current electrode, and a control electrode coupled to the control electrode of the second transistor. A sixth transistor of the first conductivity type has a first current electrode coupled to the second current electrode of the fifth transistor, a control electrode coupled to the control electrode of the second and fifth transistor, and a second current electrode. A seventh transistor of the second conductivity type has a first current electrode coupled to the second current electrode of the sixth transistor, a control electrode coupled to the first bias signal, and a second current electrode. An eighth transistor of the second conductivity type has a first current electrode coupled to the second current electrode of the seventh transistor, a control electrode for receiving the second bias signal, and a second current electrode coupled to the second voltage terminal.

In another form the second section of the gain boosting stage has a first transistor of a first conductivity type having a first current electrode coupled to a first voltage terminal, a control electrode coupled to a first bias signal, and a second current electrode. A second transistor of the first conductivity type has a first current electrode coupled to the second current electrode of the first transistor, a control electrode coupled to a second bias signal, and a second current electrode. A third transistor of a second conductivity type has a first current electrode coupled to the second current electrode of the second transistor and to a control electrode thereof, and a second current electrode. A fourth transistor of the second conductivity type has a first current electrode coupled to the second current electrode of the third transistor, a control electrode coupled to the output of the current mirror, and a second current electrode coupled to a second voltage terminal, wherein the third transistor and the fourth transistor are the second pair of series-coupled transistors. A fifth transistor of the first conductivity type has a first current electrode coupled to the first voltage terminal, a second current electrode, and a control electrode coupled to the control electrode of the first transistor. A sixth transistor of the first conductivity type has a first current electrode coupled to the second current electrode of the fifth transistor, a control electrode for receiving a second bias signal, and a second current electrode. A seventh transistor of the second conductivity type has a first current electrode coupled to the second current electrode of the sixth transistor, a control electrode coupled to the control electrode of the third transistor, and a second current electrode. An eighth transistor of the second conductivity type has a first current electrode coupled to the second current electrode of the seventh transistor, a control electrode coupled to the control electrode of the third and seventh transistors, and a second current electrode coupled to the second voltage terminal.

In another form the gain boosting stage has a first transistor of a first conductivity type having a first current electrode coupled to a first voltage terminal, a control electrode coupled to the second output of the input stage, and a second current electrode. A second transistor of the first conductivity type has a first current electrode coupled to the second current electrode of the first transistor, and a control electrode coupled to a second current electrode thereof, wherein the first transistor and second transistor comprise the first pair of series-coupled transistors. A third transistor of a second conductivity type has a first current electrode coupled to the second current electrode of the second transistor, a control electrode for receiving a first bias signal, and a second current electrode. A fourth transistor of the second conductivity type having a first current electrode coupled to the second current electrode of the third transistor, a control electrode for receiving a second bias signal, and a second current electrode coupled to a second voltage terminal. A fifth transistor of the first conductivity type has a first current electrode coupled to the first voltage terminal, a second current electrode, and a control electrode coupled to the control electrode of the second transistor. A sixth transistor of the first conductivity type having a first current electrode coupled to the second current electrode of the fifth transistor, a control electrode coupled to the control electrode of the second and fifth transistor, and a second current electrode. A seventh transistor of the second conductivity type having a first current electrode coupled to the second current electrode of the sixth transistor, a control electrode coupled to the first bias signal, and a second current electrode. An eighth transistor of the second conductivity type has a first current electrode coupled to the second current electrode of the seventh transistor, a control electrode for receiving the second bias signal, and a second current electrode coupled to the second voltage terminal. A ninth transistor of the first conductivity type has a first current electrode coupled to a first voltage terminal, a control electrode coupled to the third bias signal, and a second current electrode. A tenth transistor of the first conductivity type has a first current electrode coupled to the second current electrode of the ninth transistor, a control electrode coupled to the fourth bias signal, and a second current electrode. An eleventh transistor of the second conductivity type has a first current electrode coupled to the second current electrode of the tenth transistor and to a control electrode thereof, and a second current electrode. A twelfth transistor of the second conductivity type having a first current electrode coupled to the second current electrode of the eleventh transistor, a control electrode coupled to the output of the current mirror, and a second current electrode coupled to the second voltage terminal, wherein the eleventh transistor and twelfth transistor form the second pair of the series-coupled transistors. A thirteenth transistor of the first conductivity type has a first current electrode coupled to the first voltage terminal, a second current electrode, and a control electrode coupled to the control electrode of the ninth transistor. A fourteenth transistor of the first conductivity type has a first current electrode coupled to the second current electrode of the thirteenth transistor, a control electrode for receiving a fourth bias signal, and a second current electrode. A fifteenth transistor of the second conductivity type has a first current electrode coupled to the second current electrode of the fourteenth transistor, a control electrode coupled to the control electrode of the eleventh transistor, and a second current electrode. A sixteenth transistor of the second conductivity type has a first current electrode coupled to the second current electrode of the fifteenth transistor, a control electrode coupled to the control electrode of the eleventh and fifteenth transistors, and a second current electrode coupled to the second voltage terminal.

In another form the second section of the gain boosting stage has a first transistor of a first conductivity type having a first current electrode coupled to a first voltage terminal, a control electrode coupled to a first bias signal, and a second current electrode. A second transistor of the first conductivity type has a first current electrode coupled to the second current electrode of the first transistor, a control electrode coupled to a second bias signal, and a second current electrode. A third transistor of a second conductivity type has a first current electrode coupled to the second current electrode of the second transistor and to a control electrode thereof, and a second current electrode. A fourth transistor of the second conductivity type has a first current electrode coupled to the second current electrode of the third transistor, a control electrode coupled to the output of the current mirror, and a second current electrode coupled to a second voltage terminal wherein the third transistor and fourth transistor form the second pair of the series-coupled transistors. A fifth transistor of the first conductivity type has a first current electrode coupled to the first voltage terminal, a second current electrode, and a control electrode coupled to the control electrode of the first transistor. A sixth transistor of the first conductivity type has a first current electrode coupled to the second current electrode of the fifth transistor, a control electrode for receiving a second bias signal, and a second current electrode. A seventh transistor of the second conductivity type has a first current electrode coupled to the second current electrode of the sixth transistor, a control electrode coupled to the control electrode of the third transistor, and a second current electrode. An eighth transistor of the second conductivity type has a first current electrode coupled to the second current electrode of the seventh transistor, a control electrode coupled to the control electrode of the third and seventh transistors, and a second current electrode coupled to the second voltage terminal. A ninth transistor of the first conductivity type has a first current electrode coupled to the first voltage terminal, a control electrode coupled to the control electrode of the first transistor for receiving the first bias signal, and a second current electrode. A tenth transistor of the first conductivity type has a first current electrode coupled to the second current electrode of the ninth transistor, a control electrode coupled to the control electrode of the second transistor for receiving the second bias signal, and a second current electrode. An eleventh transistor of the second conductivity type has a first current electrode coupled to the second current electrode of the tenth transistor, a control electrode coupled to the second current electrode of the sixth transistor, and a second current electrode coupled to the second voltage terminal.

In another form the input stage further has a first transistor of a first conductivity type having a first current electrode coupled to a first voltage terminal, a control electrode, and a second current electrode. A second transistor of the first conductivity type has a first current electrode coupled to the second current electrode of the first transistor, a control electrode for receiving a bias signal, and a second current electrode coupled to the control electrode of the first transistor for providing the first output. A third transistor of a second conductivity type has a first current electrode coupled to the second current electrode of the second transistor, a control electrode for receiving a first signal of the differential input signal, and a second current electrode. A fourth transistor of the first conductivity type has a first current electrode coupled to the first voltage terminal, a control terminal, and a second current electrode. A fifth transistor of the first conductivity type has a first current electrode coupled to the second current electrode of the fourth transistor, a control electrode for receiving the bias signal, and a second current electrode for providing the second output, and coupled to the control electrode of the fourth transistor. A sixth transistor of the second conductivity type has a first current electrode coupled to the second current electrode of the fifth transistor, a control electrode for receiving a second signal of the differential input signal, and a second current electrode coupled to the second current electrode of the third transistor. A seventh transistor of the second conductivity type has a first current electrode coupled to the second current electrode of the third transistor and the sixth transistor, a control electrode for receiving a second bias signal, and a second current electrode. An eighth transistor of the second conductivity type has a first current electrode coupled to the second current electrode of the seventh transistor, a control electrode for receiving a third bias signal, and a second current electrode coupled to a second voltage terminal.

In another form the current mirror further has a ninth transistor of the first conductivity type having a first current electrode coupled to the first voltage terminal, a control electrode coupled to the control electrode of the first transistor, and a second current electrode. A tenth transistor of the first conductivity type has a first current electrode coupled to the second current electrode of the first transistor, a control electrode coupled to the control electrode of the second transistor for receiving the first bias signal, and a second current electrode. An eleventh transistor has a first current electrode coupled to the second current electrode of the tenth transistor, a second current electrode for receiving the second bias signal, and a second current electrode. A twelfth transistor has a first current electrode coupled to the second current electrode of the eleventh transistor, a control electrode coupled to the first current electrode of the eleventh transistor for providing the first control signal, and a second current electrode coupled to a second voltage terminal. In another form each of the first section and the second section of the gain boosting stage has a diode-connected transistor in one of the first and second pluralities of series-coupled transistors for mirroring current.

Other modifications may be readily implemented. Although MOSFETs of specific conductivity type are illustrated, it should be well understood that changes in the conductivity type or changes in the type of transistors may be made to implement the interconnect structures. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "connected" and "coupled" are used interchangeably and are intended to include both a direct connection and a connection via one or more intervening elements.

The invention claimed is:

1. An amplifier comprising:
   an input stage for receiving a differential input signal and providing a first output and a second output;
   a current mirror having an input coupled to the first output of the input stage and having an output for providing a first control signal;
   a gain boosting stage having a first section and a second section, each of the first section and the second section having a first input, a second input, and an output, the first input of the first section being coupled to the second output of the input stage, the second input of the first section comprising a first node between a source and a drain of a first pair of series-coupled transistors, the first input of the second section being coupled to the output of the current mirror, the second input of the second section comprising a second node between a source and a drain of a second pair of series-coupled transistors;
   a pre-driver stage having a first input coupled to the second output of the input stage, a second input coupled to the output of the first section of the gain boosting stage, a third input coupled to the output of the current mirror, a fourth input coupled to the output of the second section of the gain boosting stage, a first output coupled to the second input of the first section of the gain boosting stage, a second output, a third output coupled to the second input of the second section of the gain boosting stage, and a fourth output; and
   an output stage having a first input coupled to the second output of the pre-driver stage, a second input coupled to the fourth output of the pre-driver stage, and an output for providing an output signal.

2. The amplifier of claim 1 wherein the first section of the gain boosting stage further comprises:
   a first transistor of a first conductivity type having a first current electrode coupled to a first voltage terminal, a control electrode coupled to the second output of the input stage, and a second current electrode;
   a second transistor of the first conductivity type having a first current electrode coupled to the second current electrode of the first transistor, a control electrode coupled to a second current electrode thereof, wherein the first transistor and second transistor comprise the first pair of series-coupled transistors;
   a third transistor of a second conductivity type having a first current electrode coupled to the second current electrode of the second transistor, a control electrode for receiving a first bias signal, and a second current electrode;

a fourth transistor of the second conductivity type having a first current electrode coupled to the second current electrode of the third transistor, a control electrode for receiving a second bias signal, and a second current electrode coupled to a second voltage terminal;

a fifth transistor of the first conductivity type having a first current electrode coupled to the first voltage terminal, a second current electrode, and a control electrode coupled to the control electrode of the second transistor;

a sixth transistor of the first conductivity type having a first current electrode coupled to the second current electrode of the fifth transistor, a control electrode coupled to the control electrode of the second and fifth transistor, and a second current electrode;

a seventh transistor of the second conductivity type having a first current electrode coupled to the second current electrode of the sixth transistor, a control electrode coupled to the first bias signal, and a second current electrode; and an eighth transistor of the second conductivity type having a first current electrode coupled to the second current electrode of the seventh transistor, a control electrode for receiving the second bias signal, and a second current electrode coupled to the second voltage terminal.

3. The amplifier of claim 1 wherein the second section of the gain boosting stage further comprises:

a first transistor of a first conductivity type having a first current electrode coupled to a first voltage terminal, a control electrode coupled to a first bias signal, and a second current electrode;

a second transistor of the first conductivity type having a first current electrode coupled to the second current electrode of the first transistor, a control electrode coupled to a second bias signal, and a second current electrode;

a third transistor of a second conductivity type having a first current electrode coupled to the second current electrode of the second transistor and to a control electrode thereof, and a second current electrode;

a fourth transistor of the second conductivity type having a first current electrode coupled to the second current electrode of the third transistor, a control electrode coupled to the output of the current mirror, and a second current electrode coupled to a second voltage terminal, wherein the third transistor and fourth transistor comprise the second pair of series-coupled transistors;

a fifth transistor of the first conductivity type having a first current electrode coupled to the first voltage terminal, a second current electrode, and a control electrode coupled to the control electrode of the first transistor;

a sixth transistor of the first conductivity type having a first current electrode coupled to the second current electrode of the fifth transistor, a control electrode for receiving the second bias signal, and a second current electrode;

a seventh transistor of the second conductivity type having a first current electrode coupled to the second current electrode of the sixth transistor, a control electrode coupled to the control electrode of the third transistor, and a second current electrode; and an eighth transistor of the second conductivity type having a first current electrode coupled to the second current electrode of the seventh transistor, a control electrode coupled to the control electrode of the third and seventh transistors, and a second current electrode coupled to the second voltage terminal.

4. The amplifier of claim 1 wherein the gain boosting stage further comprises:

a first transistor of a first conductivity type having a first current electrode coupled to a first voltage terminal, a control electrode coupled to the second output of the input stage, and a second current electrode;

a second transistor of the first conductivity type having a first current electrode coupled to the second current electrode of the first transistor, a control electrode coupled to a second current electrode thereof, wherein the first transistor and second transistor comprise the first pair of series-coupled transistors;

a third transistor of a second conductivity type having a first current electrode coupled to the second current electrode of the second transistor, a control electrode for receiving a first bias signal, and a second current electrode;

a fourth transistor of the second conductivity type having a first current electrode coupled to the second current electrode of the third transistor, a control electrode for receiving a second bias signal, and a second current electrode coupled to a second voltage terminal;

a fifth transistor of the first conductivity type having a first current electrode coupled to the first voltage terminal, a second current electrode, and a control electrode coupled to the control electrode of the second transistor;

a sixth transistor of the first conductivity type having a first current electrode coupled to the second current electrode of the fifth transistor, a control electrode coupled to the control electrode of the second and fifth transistor, and a second current electrode;

a seventh transistor of the second conductivity type having a first current electrode coupled to the second current electrode of the sixth transistor, a control electrode coupled to the first bias signal, and a second current electrode;

an eighth transistor of the second conductivity type having a first current electrode coupled to the second current electrode of the seventh transistor, a control electrode for receiving the second bias signal, and a second current electrode coupled to the second voltage terminal;

a ninth transistor of the first conductivity type having a first current electrode coupled to the first voltage terminal, a control electrode coupled to a third bias signal, and a second current electrode;

a tenth transistor of the first conductivity type having a first current electrode coupled to the second current electrode of the ninth transistor, a control electrode coupled to a fourth bias signal, and a second current electrode;

an eleventh transistor of the second conductivity type having a first current electrode coupled to the second current electrode of the tenth transistor and to a control electrode thereof, and a second current electrode;

a twelfth transistor of the second conductivity type having a first current electrode coupled to the second current electrode of the eleventh transistor, a control electrode coupled to the output of the current mirror, and a second current electrode coupled to the second voltage terminal, wherein the eleventh transistor and twelfth transistor comprise the second pair of series-coupled transistors;

a thirteenth transistor of the first conductivity type having a first current electrode coupled to the first voltage terminal, a second current electrode, and a control electrode coupled to the control electrode of the ninth transistor;

a fourteenth transistor of the first conductivity type having a first current electrode coupled to the second current electrode of the thirteenth transistor, a control electrode for receiving the fourth bias signal, and a second current electrode;

a fifteenth transistor of the second conductivity type having a first current electrode coupled to the second current electrode of the fourteenth transistor, a control electrode coupled to the control electrode of the eleventh transistor, and a second current electrode; and a sixteenth transistor of the second conductivity type having a first current electrode coupled to the second current electrode of the fifteenth transistor, a control electrode coupled to the control electrode of the eleventh and fifteenth transistors, and a second current electrode coupled to the second voltage terminal.

5. The amplifier of claim 1 wherein the second section of the gain boosting stage further comprises:

a first transistor of a first conductivity type having a first current electrode coupled to a first voltage terminal, a control electrode coupled to a first bias signal, and a second current electrode;

a second transistor of the first conductivity type having a first current electrode coupled to the second current electrode of the first transistor, a control electrode coupled to a second bias signal, and a second current electrode;

a third transistor of a second conductivity type having a first current electrode coupled to the second current electrode of the second transistor and to a control electrode thereof, and a second current electrode;

a fourth transistor of the second conductivity type having a first current electrode coupled to the second current electrode of the third transistor, a control electrode coupled to the output of the current mirror, and a second current electrode coupled to a second voltage terminal, wherein the third transistor and fourth transistor comprise the second pair of the series-coupled transistors;

a fifth transistor of the first conductivity type having a first current electrode coupled to the first voltage terminal, a second current electrode, and a control electrode coupled to the control electrode of the first transistor;

a sixth transistor of the first conductivity type having a first current electrode coupled to the second current electrode of the fifth transistor, a control electrode for receiving the second bias signal, and a second current electrode;

a seventh transistor of the second conductivity type having a first current electrode coupled to the second current electrode of the sixth transistor, a control electrode for receiving a third bias signal, and a second current electrode;

an eighth transistor of the second conductivity type having a first current electrode coupled to the second current electrode of the seventh transistor, a control electrode coupled to the control electrode of the third transistor, and a second current electrode; and a ninth transistor of the first conductivity type having a first current electrode coupled to the second current electrode of the eighth transistor, a control electrode coupled to the control electrode of the third transistor and the eighth transistor, and a second current electrode coupled to the second voltage terminal.

6. The amplifier of claim 1 wherein the input stage further comprises:

a first transistor of a first conductivity type having a first current electrode coupled to a first voltage terminal, a control electrode, and a second current electrode;

a second transistor of the first conductivity type having a first current electrode coupled to the second current electrode of the first transistor, a control electrode for receiving a first bias signal, and a second current electrode coupled to the control electrode of the first transistor for providing the first output;

a third transistor of a second conductivity type having a first current electrode coupled to the second current electrode of the second transistor, a control electrode for receiving a first signal of the differential input signal, and a second current electrode;

a fourth transistor of the first conductivity type having a first current electrode coupled to the first voltage terminal, a control terminal, and a second current electrode;

a fifth transistor of the first conductivity type having a first current electrode coupled to the second current electrode of the fourth transistor, a control electrode for receiving the first bias signal, and a second current electrode for providing the second output and being coupled to the control electrode of the fourth transistor;

a sixth transistor of the second conductivity type having a first current electrode coupled to the second current electrode of the fifth transistor, a control electrode for receiving a second signal of the differential input signal, and a second current electrode coupled to the second current electrode of the third transistor;

a seventh transistor of the second conductivity type having a first current electrode coupled to the second current electrode of the third transistor and the sixth transistor, a control electrode for receiving a second bias signal, and a second current electrode; and an eighth transistor of the second conductivity type having a first current electrode coupled to the second current electrode of the seventh transistor, a control electrode for receiving a third bias signal, and a second current electrode coupled to a second voltage terminal.

7. The amplifier of claim 6 wherein the current mirror further comprises:

a ninth transistor of the first conductivity type having a first current electrode coupled to the first voltage terminal, a control electrode coupled to the control electrode of the first transistor, and a second current electrode;

a tenth transistor of the first conductivity type having a first current electrode coupled to the second current electrode of the ninth transistor, a control electrode coupled to the control electrode of the second transistor for receiving the first bias signal, and a second current electrode;

an eleventh transistor having a first current electrode coupled to the second current electrode of the tenth transistor, a second current electrode for receiving the second bias signal, and a second current electrode; and a twelfth transistor having a first current electrode coupled to the second current electrode of the eleventh transistor, a control electrode coupled to the first current electrode of the eleventh transistor for providing the first control signal, and a second current electrode coupled to a second voltage terminal.

8. A method comprising:

receiving a differential input signal and providing a first output signal and a second output signal in response thereto;

coupling the first output signal to a current mirror for providing a control signal;

coupling the second output signal to both a gain boosting stage for biasing the gain boosting stage and to a driver stage;

coupling the control signal to both the gain boosting stage for biasing the gain boosting stage and to the driver stage;

generating within the driver stage first and second input signals for the gain boosting stage;

amplifying the first and second input signals within the gain boosting stage to generate first and second output signals with a predetermined gain; and using the first and second output signals to drive an output stage and provide an output voltage at an output terminal.

9. The method of claim 8 further comprising:

coupling the first and second input signals generated within the driver stage to respective first and second circuit nodes within the gain boosting stage and between respective first and second pairs of series-coupled transistors within the gain boosting stage, thereby not coupling the first and second input signals to a control electrode of a transistor.

10. The method of claim 9 further comprising:

implementing the output stage as a Class AB output stage.

11. The method of claim 9 further comprising:

implementing the gain boosting stage with first and second sections, each being biased by two separate bias signals and having a same number of transistors in each section.

12. The method of claim 11 further comprising:

increasing gain of the gain stage by respectively adding a plurality of series-coupled transistors in parallel to each of the first and second sections of the gain boosting stage for generating the first and second output signals.

13. An amplifier comprising:

an input stage for receiving a differential input signal and providing a first output and a second output;

a current mirror having an input coupled to the first output of the input stage and having an output for providing a first control signal;

a gain boosting stage having a first section and a second section, each of the first section and the second section comprising first and second pluralities of series-coupled transistors of first and second opposite conductivities, all transistors of a first conductivity of the first section being biased by one of first and second bias signals, all transistors of a second conductivity of the second section being biased by one of third and fourth bias signals, the gain boosting stage having a first input, a second input, and an output, the first input of the first section being coupled to the second output of the input stage, the second input of the first section comprising a first node between a source and a drain of a first pair of series-coupled transistors, the first input of the second section being coupled to the output of the current mirror, the second input of the second section comprising a second node between a source and a drain of a second pair of series-coupled transistors;

a pre-driver stage having a first input coupled to the second output of the input stage, a second input coupled to the output of the first section of the gain boosting stage, a third input coupled to the output of the current mirror, a fourth input coupled to the output of the second section of the gain boosting stage, a first output coupled to the second input of the first section of the gain boosting stage, a second output, a third output coupled to the second input of the second section of the gain boosting stage, and a fourth output; and an output stage having a first input coupled to the second output of the pre-driver stage, a second input coupled to the fourth output of the pre-driver stage, and an output for providing an output signal.

14. The amplifier of claim 13 wherein the first section of the gain boosting stage further comprises:

a first transistor of a first conductivity type having a first current electrode coupled to a first voltage terminal, a control electrode coupled to the second output of the input stage, and a second current electrode;

a second transistor of the first conductivity type having a first current electrode coupled to the second current electrode of the first transistor, a control electrode coupled to a second current electrode thereof, wherein the first transistor and second transistor comprise the first pair of series-coupled transistors;

a third transistor of a second conductivity type having a first current electrode coupled to the second current electrode of the second transistor, a control electrode for receiving a first bias signal, and a second current electrode;

a fourth transistor of the second conductivity type having a first current electrode coupled to the second current electrode of the third transistor, a control electrode for receiving a second bias signal, and a second current electrode coupled to a second voltage terminal;

a fifth transistor of the first conductivity type having a first current electrode coupled to the first voltage terminal, a second current electrode, and a control electrode coupled to the control electrode of the second transistor;

a sixth transistor of the first conductivity type having a first current electrode coupled to the second current electrode of the fifth transistor, a control electrode coupled to the control electrode of the second and fifth transistor, and a second current electrode;

a seventh transistor of the second conductivity type having a first current electrode coupled to the second current electrode of the sixth transistor, a control electrode coupled to the first bias signal, and a second current electrode; and an eighth transistor of the second conductivity type having a first current electrode coupled to the second current electrode of the seventh transistor, a control electrode for receiving the second bias signal, and a second current electrode coupled to the second voltage terminal.

15. The amplifier of claim 13 wherein the second section of the gain boosting stage further comprises:

a first transistor of a first conductivity type having a first current electrode coupled to a first voltage terminal, a control electrode coupled to a first bias signal, and a second current electrode;

a second transistor of the first conductivity type having a first current electrode coupled to the second current electrode of the first transistor, a control electrode coupled to a second bias signal, and a second current electrode;

a third transistor of a second conductivity type having a first current electrode coupled to the second current electrode of the second transistor and to a control electrode thereof, and a second current electrode;

a fourth transistor of the second conductivity type having a first current electrode coupled to the second current electrode of the third transistor, a control electrode coupled to the output of the current mirror, and a second current electrode coupled to a second voltage terminal, wherein the third transistor and fourth transistor comprise the second pair of series-coupled transistors;

a fifth transistor of the first conductivity type having a first current electrode coupled to the first voltage terminal, a second current electrode, and a control electrode coupled to the control electrode of the first transistor;

a sixth transistor of the first conductivity type having a first current electrode coupled to the second current electrode of the fifth transistor, a control electrode for receiving a second bias signal, and a second current electrode;
a seventh transistor of the second conductivity type having a first current electrode coupled to the second current electrode of the sixth transistor, a control electrode coupled to the control electrode of the third transistor, and a second current electrode; and
an eighth transistor of the second conductivity type having a first current electrode coupled to the second current electrode of the seventh transistor, a control electrode coupled to the control electrode of the third and seventh transistors, and a second current electrode coupled to the second voltage terminal.

16. The amplifier of claim 13 wherein the gain boosting stage further comprises:
a first transistor of a first conductivity type having a first current electrode coupled to a first voltage terminal, a control electrode coupled to the second output of the input stage, and a second current electrode;
a second transistor of the first conductivity type having a first current electrode coupled to the second current electrode of the first transistor, a control electrode coupled to a second current electrode thereof, wherein the first transistor and second transistor comprise the first pair of series-coupled transistors;
a third transistor of a second conductivity type having a first current electrode coupled to the second current electrode of the second transistor, a control electrode for receiving a first bias signal, and a second current electrode;
a fourth transistor of the second conductivity type having a first current electrode coupled to the second current electrode of the third transistor, a control electrode for receiving a second bias signal, and a second current electrode coupled to a second voltage terminal;
a fifth transistor of the first conductivity type having a first current electrode coupled to the first voltage terminal, a second current electrode, and a control electrode coupled to the control electrode of the second transistor;
a sixth transistor of the first conductivity type having a first current electrode coupled to the second current electrode of the fifth transistor, a control electrode coupled to the control electrode of the second and fifth transistors, and a second current electrode;
a seventh transistor of the second conductivity type having a first current electrode coupled to the second current electrode of the sixth transistor, a control electrode coupled to the first bias signal, and a second current electrode;
an eighth transistor of the second conductivity type having a first current electrode coupled to the second current electrode of the seventh transistor, a control electrode for receiving the second bias signal, and a second current electrode coupled to the second voltage terminal;
a ninth transistor of the first conductivity type having a first current electrode coupled to the first voltage terminal, a control electrode coupled to a third bias signal, and a second current electrode;
a tenth transistor of the first conductivity type having a first current electrode coupled to the second current electrode of the ninth transistor, a control electrode coupled to a fourth bias signal, and a second current electrode;
an eleventh transistor of the second conductivity type having a first current electrode coupled to the second current electrode of the tenth transistor and to a control electrode thereof, and a second current electrode;
a twelfth transistor of the second conductivity type having a first current electrode coupled to the second current electrode of the eleventh transistor, a control electrode coupled to the output of the current mirror, and a second current electrode coupled to the second voltage terminal, wherein the eleventh transistor and twelfth transistor comprise the second pair of series-coupled transistors;
a thirteenth transistor of the first conductivity type having a first current electrode coupled to the first voltage terminal, a second current electrode, and a control electrode coupled to the control electrode of the ninth transistor;
a fourteenth transistor of the first conductivity type having a first current electrode coupled to the second current electrode of the thirteenth transistor, a control electrode for receiving a fourth bias signal, and a second current electrode;
a fifteenth transistor of the second conductivity type having a first current electrode coupled to the second current electrode of the fourteenth transistor, a control electrode coupled to the control electrode of the eleventh transistor, and a second current electrode; and
a sixteenth transistor of the second conductivity type having a first current electrode coupled to the second current electrode of the fifteenth transistor, a control electrode coupled to the control electrode of the eleventh and fifteenth transistors, and a second current electrode coupled to the second voltage terminal.

17. The amplifier of claim 13 wherein the second section of the gain boosting stage further comprises:
a first transistor of a first conductivity type having a first current electrode coupled to a first voltage terminal, a control electrode coupled to a first bias signal, and a second current electrode;
a second transistor of the first conductivity type having a first current electrode coupled to the second current electrode of the first transistor, a control electrode coupled to a second bias signal, and a second current electrode;
a third transistor of a second conductivity type having a first current electrode coupled to the second current electrode of the second transistor and to a control electrode thereof, and a second current electrode;
a fourth transistor of the second conductivity type having a first current electrode coupled to the second current electrode of the third transistor, a control electrode coupled to the output of the current mirror, and a second current electrode coupled to a second voltage terminal, wherein the third transistor and fourth transistor comprise the second pair of series-coupled transistors;
a fifth transistor of the first conductivity type having a first current electrode coupled to the first voltage terminal, a second current electrode, and a control electrode coupled to the control electrode of the first transistor;
a sixth transistor of the first conductivity type having a first current electrode coupled to the second current electrode of the fifth transistor, a control electrode for receiving the second bias signal, and a second current electrode;
a seventh transistor of the second conductivity type having a first current electrode coupled to the second current electrode of the sixth transistor, a control electrode coupled to a third bias signal, and a second current electrode;
an eighth transistor of the second conductivity type having a first current electrode coupled to the second current electrode of the seventh transistor, a control electrode coupled to the control electrode of the third transistor, and a second current electrode; and a ninth transistor of the first conductivity type having a first current electrode coupled to the second current electrode of the eighth transistor, a control electrode coupled to the control electrode of the third and eighth transistors, and a second current electrode coupled to the second voltage terminal.

18. The amplifier of claim 13 wherein the input stage further comprises:
   a first transistor of a first conductivity type having a first current electrode coupled to a first voltage terminal, a control electrode, and a second current electrode;
   a second transistor of the first conductivity type having a first current electrode coupled to the second current electrode of the first transistor, a control electrode for receiving a first bias signal, and a second current electrode coupled to the control electrode of the first transistor for providing the first output;
   a third transistor of a second conductivity type having a first current electrode coupled to the second current electrode of the second transistor, a control electrode for receiving a first signal of the differential input signal, and a second current electrode;
   a fourth transistor of the first conductivity type having a first current electrode coupled to the first voltage terminal, a control terminal, and a second current electrode;
   a fifth transistor of the first conductivity type having a first current electrode coupled to the second current electrode of the fourth transistor, a control electrode for receiving the first bias signal, and a second current electrode for providing the second output and being coupled to the control electrode of the fourth transistor;
   a sixth transistor of the second conductivity type having a first current electrode coupled to the second current electrode of the fifth transistor, a control electrode for receiving a second signal of the differential input signal, and a second current electrode coupled to the second current electrode of the third transistor;
   a seventh transistor of the second conductivity type having a first current electrode coupled to the second current electrode of the third transistor and the sixth transistor, a control electrode for receiving a second bias signal, and a second current electrode; and
   an eighth transistor of the second conductivity type having a first current electrode coupled to the second current electrode of the seventh transistor, a control electrode for receiving a third bias signal, and a second current electrode coupled to a second voltage terminal.

19. The amplifier of claim 18 wherein the current mirror further comprises:
   a ninth transistor of the first conductivity type having a first current electrode coupled to the first voltage terminal, a control electrode coupled to the control electrode of the first transistor, and a second current electrode;
   a tenth transistor of the first conductivity type having a first current electrode coupled to the second current electrode of the ninth transistor, a control electrode coupled to the control electrode of the second transistor for receiving the first bias signal, and a second current electrode;
   an eleventh transistor having a first current electrode coupled to the second current electrode of the tenth transistor, a control electrode for receiving the second bias signal, and a second current electrode; and
   a twelfth transistor having a first current electrode coupled to the second current electrode of the eleventh transistor, a control electrode coupled to the first current electrode of the eleventh transistor for providing the first control signal, and a second current electrode coupled to the second voltage terminal.

20. The amplifier of claim 13 wherein each of the first section and the second section of the gain boosting stage further comprises a diode-connected transistor in one of the first and second pluralities of series-coupled transistors for mirroring current.

* * * * *